United States Patent [19]

Crowne

[11] 4,245,161
[45] Jan. 13, 1981

[54] PEIERLS-TRANSITION FAR-INFRARED SOURCE

[75] Inventor: Frank J. Crowne, Greenbelt, Md.

[73] Assignee: The United States of America as represented by the Secretary of the Army, Washington, D.C.

[21] Appl. No.: 84,048

[22] Filed: Oct. 12, 1979

[51] Int. Cl.³ .................... H01L 33/00; H01L 45/00; H01L 29/28
[52] U.S. Cl. .................................. 250/504 R; 357/4; 357/8; 357/17
[58] Field of Search .......................... 357/8, 4, 16, 17; 250/504

[56] References Cited

U.S. PATENT DOCUMENTS

| | | | |
|---|---|---|---|
| 3,262,059 | 7/1966 | Gunn | 330/5 |
| 3,349,344 | 10/1967 | Chynoweth et al. | 357/3 |
| 3,517,244 | 1/1970 | Picas et al. | 357/17 |
| 3,558,889 | 1/1971 | Chang et al. | 357/3 |
| 3,626,328 | 12/1971 | Esaki et al. | 357/3 |
| 3,778,893 | 12/1973 | Thompson | 331/107 S |
| 4,163,238 | 7/1979 | Esaki et al. | 357/16 |

OTHER PUBLICATIONS

Kroemer, "Negative Bulk Mobility Devices . . . ", IEEE International Electron Device Meeting, 1974, Technical Digest pp. 3-4 (pub. Dec. 8, 1974).
Chu et al., Physical Review Letters, vol. 31, No. 25, Dec. 17, 1973, pp. 1491–1494.
Lee et al., Physical Review Letters, vol. 31, No. 7, Aug. 13, 1973, pp. 462–465.

*Primary Examiner*—William D. Larkins
*Attorney, Agent, or Firm*—Nathan Edelberg; Robert P. Gibson; Saul Elbaum

[57] ABSTRACT

A Peierls transition far-infrared radiation source comprised of a block of an organic one dimensional metal stressed at the ends and having a potential difference applied.

8 Claims, 3 Drawing Figures

PEIERLS-TRANSITION FAR-INFRARED SOURCE

RIGHTS OF THE GOVERNMENT

The invention described herein may be manufactured, used, and licensed by or for the United States Government for governmental purposes without the payment to me of any royalty thereon.

The present invention is directed to a radiation source which produces electromagnetic radiation in the far-infrared range.

For certain radar applications it is desired to use radiation in the far-infrared range. Conventional solid-state radiators cannot produce radiation in the far-infrared part of the spectrum, and in general, the prior art has not produced a source which can effectively operate in this range.

It is therefore an object of the invention to provide a source which produces radiation in the far-infrared part of the spectrum down to the millimeter range.

It is a further object of the invention to provide a source which can generate considerable power, and which can be efficiently cooled.

It is still a further object of the invention to provide a source having a highly directional output.

It is still a further object of the invention to provide a source which is pressure-tunable, field-tunable, and temperature-tunable.

The above objects are accomplished by providing a member made of an organic one dimensional metal; such a substance has the property of behaving like a metal along one crystal direction only above a certain temperature known as the Peierls temperature. Below this temperature the material develops a gap (Peierls gap) at the metallic Fermi level which disappears when the crystal is stressed. The device is operated below the Peierls temperature and pressure is applied near the ends of the member, while a potential difference is applied to electrodes situated near the ends. The device emits narrow-band radiation centered around the transition frequency of the above-mentioned Peierls gap; the radiation is in the far-infrared region and extends down to millimeter ranges.

The invention will be better understood by referring to the accompanying drawing in which.

Figure 1:
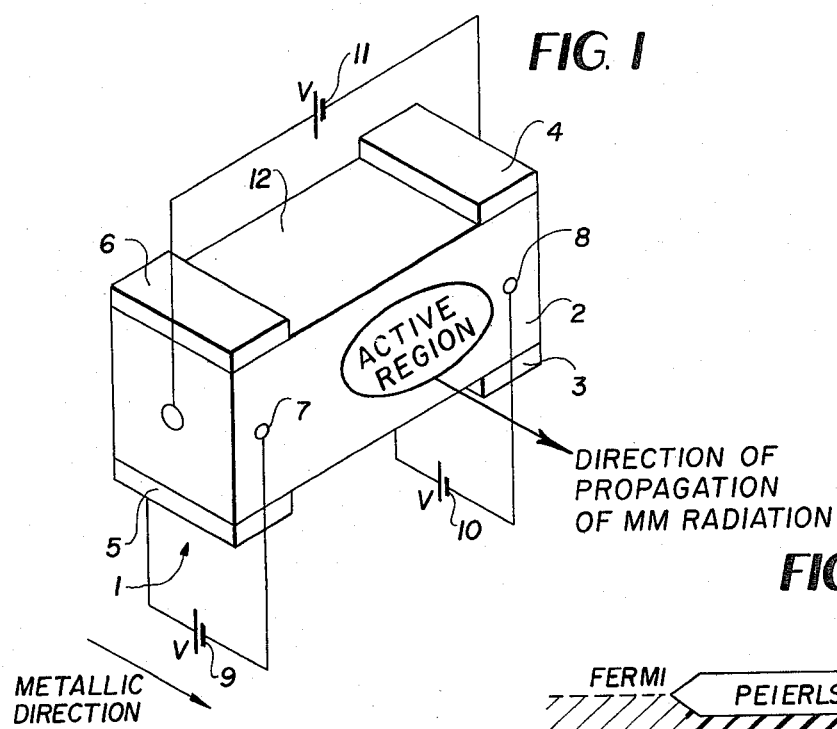
FIG. 1 is an illustration of an embodiment of the invention.

Referring to FIG. 1, device 1 is comprised of a block 2 of an organic one dimensional metal such as TTF-TCNQ. As is known, organic one dimensional metals have the property of behaving as metals along one crystal direction only when above a certain temperature called the Peierls temperature. Below this temperature, such materials develop a gap at the metallic Fermi level on the order of 0.01 ev, corresponding to a radiation wavelength of 0.1 mm; this gap disappears when the crystal is stressed.

Referring again to FIG. 1, organic one dimensional metal block 2 is a metal only in the short direction of the block. Thus, if an electrical field is applied in the short direction, free electrons will be available and will move so as to cause a current to flow along the short direction of the block. However, if a field were applied across the block in the direction perpendicular to the short direction, no current would flow.

As mentioned above, the gap which exists when the material is operated below the Peierls temperature disappears when the crystal is stressed. Accordingly, crystal 2 has pressure means 3, 4, 5 and 6 applied to the ends thereof to render the ends of the crystal block metallic while the center is insulating. Pressure means 3, 4, 5 and 6 are shown as plates in the FIG., but may be any expendient devised by one skilled in the art to apply pressure to selective regions of a block.

Figure 2:
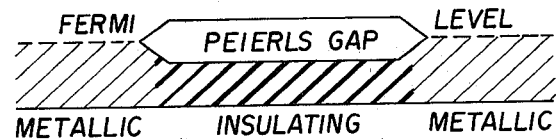
FIG. 2 is an energy band diagram of the device shown in FIG. 1.

The energy band diagram of FIG. 2 illustrates the internal condition of the crystal. As can be seen, the ends of the block are metallic and have free electrons which are available to be raised into the conduction band while the Peierls gap exists at the center of the block, and the center therefore is insulating. When voltage sources 9 and 10 are applied across electrodes 7 and 8 respectively (there are two electrodes 7, one shown and the other on the opposite face of the crystal at the same height as the electrode shown, and similarly for electrodes 8), large currents flow in the metallic regions producing hot electrons and holes which diffuse into the region of the Peierls gap; a further voltage source 11 can enhance this effect. Because of the one dimensional character of the material, these carriers recombine slowly in the region of the Peierls gap and produce a population inversion, and laser action.

Figure 3:
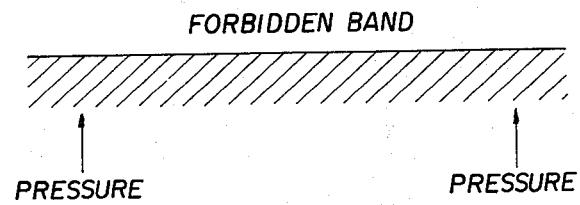
FIG. 3 is a graph of the density of states versus energy for the device of FIG. 1.
Figure 3:
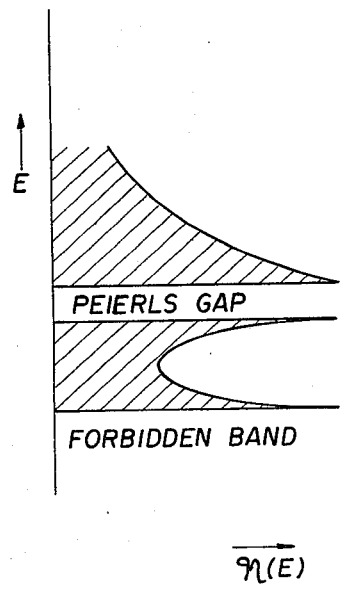

The resulting radiation is narrow band, and centered around the transition frequency of the Peierls gap. The reason for this can be understood by referring to FIG. 3 which is a graph of the density of states versus energy. It is seen that the density of states is the largest at the edges of the Peierls gap which is due again to the one dimensionality of the material. Since the density of states is the largest at the gap, there is not much radiation at other frequencies, and the Peierls gap-centered radiation is relatively pure.

The Peierls gap is of the order 0.01 ev, and this corresponds to a radiation wavelength of 0.1 mm, which is in the far-infrared range. Because the radiator is a bulk rather than a junction device, it can generate considerable power and can be efficiently cooled. It can be physically quite large in size, and should provide highly directional beams of radiation due to the metallic nature of the material surrounding the active medium. The frequency output of the device differs with pressure, applied field, and temperature, and the device therefore should be pressure-tunable, field-tunable, and temperature-tunable.

I wish it to be understood that I do not desire to be limited to the exact details of construction shown and described, for obvious modifications can be made by a person skilled in the art.

I claim:

1. A Peierls transition far-infrared radiation source comprising a member made of an organic one dimensional metal, means for exerting pressure near the ends of said member in a first direction perpendicular to the said one dimension, and means for creating a potential difference across said member near the ends thereof along said one dimension.

2. The source of claim 1 further including means for creating a potential difference along a dimension of said member which is perpendicular to said one dimension and to said first direction.

3. The source of claim 1 wherein said organic one dimensional metal is TTF-TCNQ.

4. The source of claim 1 wherein said means for exerting a pressure comprise pressure plates.

5. The source of claim 1, which is operated below the Peierls temperature.

6. The source of claim 1, which is pressure-tunable.

7. The source of claim 1, which is temperature-tunable.

8. The source of claim 1, which is field-tunable.

* * * * *